(12) United States Patent
Leung et al.

(10) Patent No.: US 6,413,882 B1
(45) Date of Patent: *Jul. 2, 2002

(54) LOW DIELECTRIC FOAM DIELECTRIC FORMED FROM POLYMER DECOMPOSITION

(75) Inventors: Roger Yu-Kwan Leung, San Jose; Suzanne Case, Sunnyvale, both of CA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/291,511

(22) Filed: Apr. 14, 1999

(51) Int. Cl.$^7$ .................. H01L 21/31; H01L 21/469
(52) U.S. Cl. .................. 438/781; 438/778; 438/780
(58) Field of Search .................. 438/778, 780, 438/781, 790; 528/10

(56) References Cited

U.S. PATENT DOCUMENTS

| | | | |
|---|---|---|---|
| 5,470,802 A | 11/1995 | Gnade et al. | 437/238 |
| 5,494,858 A | 2/1996 | Gnade et al. | 437/231 |
| 5,504,042 A | 4/1996 | Cho et al. | 437/247 |
| 5,523,615 A | 6/1996 | Cho et al. | 257/632 |
| 5,561,318 A | 10/1996 | Gnade et al. | 257/638 |
| 5,723,024 A | 3/1998 | Berg | 203/57 |
| 5,776,990 A | 7/1998 | Hedrick et al. | 521/77 |
| 5,847,443 A | 12/1998 | Cho et al. | 257/632 |
| 6,043,330 A * | 3/2000 | Hacker et al. | 528/12 |
| 6,204,202 B1 * | 3/2001 | Leung et al. | 438/781 |

FOREIGN PATENT DOCUMENTS

| | | | |
|---|---|---|---|
| EP | 0775 669 | | 5/1997 |
| JP | 03199043 | * | 8/1992 |

OTHER PUBLICATIONS

Hedrick, J.L. et al, "Polyimide Nanofoams From Aliphatic Polyester–Based Copolymers", Chem. Mater. 10, p. 39–49, Jan. 19, 1998.
Miller, R.D. et, al "Modified Silsesquioxane Structures For Use In Low Dielectric Constant Interconnect Applications" IBM 1998 Proceedings—Dielectrics For ULSI Multilevel Interconnecting Conference.Feb. 16, 1998. p. 293–4.
Aoi, Nabuo; "Novel Porous Films Having Low Dielectric Constants Synthesized by Liquid Phase Silylation of Spin–On Sol For Intermetal Dielectrics", Japan J.Appl. Physics, 36, Pt. 1,p. 1355, 1997.
Hedrick,J.L.et al; "High Temperature Polymer Foams" Polymer 34, 22; p. 4717–26;1993.
Hedrick, JL, et al; "High Temperature Polyimide Nanofoams for Microelectronic Applications"; Reactive & Functional Polymers 30 (1996) p., 43–53.
Chemical Abstracts 1997:236938; Vong, Ms.W.,Et Al, Chemical Modification Of Silica Gels. J.Sol–Gel Sci Technol. (1997) 8(1/2/3), p. 499–505.
Chemical Abstracts 194:280887; Matsuda, A. Et al, Changes in Physical Properties and Structures of Sol Gel Derived SiO Films in an Environment of High Temperature and High Humidity. J. Ceram. Soc. Jpn (1994) 102 (Apr.) 330–5.
Chemical Abstracts 1993:450413; Moriya, Y.; Preparation of Polymer Hybrids of the Silica–PVA or Silica–PEG System and Porous Materials Made From the Hybrid Gels. J. Ceram. Soc. Jpn. (1993) 101 (May), 518–21.
Chemical Abstracts 1992:517040; Yazawa, T.; Manufacture of Porous Silica–Based Glass by Sol–Gel Process; JP Kokai 04–1300026 A2.
Chemical Abstracts 1990:428190; Nakanishi, K. "Process for Producing Porous Glass" EP 363697 A1.
Chemical Abstracts 1991:434201; Takei, K., et al Manufacture of Vitreous Silica JP Kokai 03040926 A2.
Chemical Abstracts 1992:8011 : Matsuno, Y.; "Nonreflective Films and their Manufacture"JP Kokai 03199043 A2.
Chemical Abstracts 1995:790919 Bagshaw, S. Et al; "Templating of Mesoporous Molecular Sieves by Nonionic Polyethylene Oxide Surfactants"; Science (1995) 269(5228), 1242–4.
Chemical Abstracts 1986:484023; Ravaine, D.; "A New Family of Organically Modified Silicates Prepared from Gels"; J. Non–Cryst.Solids (1986), 82(1–3), 210–19.

* cited by examiner

Primary Examiner—Alexander G. Ghyka
(74) Attorney, Agent, or Firm—Roberts & Mercanti, LLP

(57) ABSTRACT

The present invention relates to novel low dielectric constant nanoporous dielectric films having improved mechanical strength, and to improved processes for producing the same on substrates suitable for use in the production of integrated circuits. The nanoporous dielectric films are prepared by a process of preparing a mixture of a spin-on-glass material with a suitable thermally degradable polymer that is soluble in nonpolar solvents. Applying the resulting mixture onto a substrate suitable for use in the production of an integrated circuit, to produce a coated substrate. The coated substrate is then heated for a time and at one or more temperatures effective to remove the thermally degradable polymer, so as to produce the desired low dielectric nanoporous dielectric film.

32 Claims, No Drawings

LOW DIELECTRIC FOAM DIELECTRIC FORMED FROM POLYMER DECOMPOSITION

FIELD OF THE INVENTION

The present invention relates to novel low dielectric constant nanoporous films having improved mechanical strength, and to improved processes for producing the same on substrates suitable for use in the production of integrated circuits. The nanoporous films of the invention are prepared using silicon-based starting materials and thermally degradable polymers, copolymers and/or oligomers selected to be soluble in the employed starting materials and in nonpolar solvent systems.

BACKGROUND OF THE INVENTION

As feature sizes in integrated circuits approach 0.25 μm and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a longstanding need in the art for further improvements in processing methods and in the optimization of both the dielectric and mechanical properties of such materials used in the manufacture of integrated circuits.

Nanoporous Films

One material with a low dielectric constant are nanoporous films prepared from silica, i.e., silicon-based materials. Air has a dielectric constant of 1, and when air is introduced into a suitable silica material having a nanometer-scale pore structure, such films can be prepared with relatively low dielectric constants ("k"). Nanoporous silica materials are attractive because similar precursors, including organic-substituted silanes, e.g., tetraethoxysilane ("TEOS"), are used for the currently employed spin-on-glasses ("S.O.G.") and chemical vapor disposition ("CVD") of silica $SiO_2$. Nanoporous silica materials are also attractive because it is possible to control the pore size, and hence the density, material strength and dielectric constant of the resulting film material. In addition to a low k, nanoporous films offer other advantages including: 1) thermal stability to 900° C., 2) substantially small pore size, i.e., at least an order of magnitude smaller in scale than the microelectronic features of the integrated circuit), 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional S.O.G. processing.

Thus, high porosity in silica materials leads to a lower dielectric constant than would otherwise be available from the same materials in nonporous form. An additional advantage, is that additional compositions and processes may be employed to produce nanoporous films while varying the relative density of the material. Other materials requirements include the need to have all pores substantially smaller than circuit feature sizes, the need to manage the strength decrease associated with porosity, and the role of surface chemistry on dielectric constant and environmental stability.

Density (or the inverse, porosity) is the key parameter of nanoporous films that controls the dielectric constant of the material, and this property is readily varied over a continuous spectrum from the extremes of an air gap at a porosity of 100% to a dense silica with a porosity of 0%. As density increases, dielectric constant and mechanical strength increase but the degree of porosity decreases, and vice versa. This suggests that the density range of nanoporous films must be optimally balanced between for the desired range of low dielectric constant, and the mechanical properties acceptable for the desired application.

Nanoporous silica films have previously been fabricated by a number of methods. For example, nanoporous films have been prepared using a mixture of a solvent and a silica precursor, which is deposited on a substrate suitable for the purpose.

When forming such nanoporous films, e.g., by spin-coating, the film coating is typically catalyzed with an acid or base catalyst and additional water to cause polymerization/gelation ("aging") and to yield sufficient strength so that the film does not shrink significantly during drying.

Another previously proposed method for providing nanoporous silica films was based on the observation that film thickness and density/dielectric constant can be independently controlled by using a mixture of two solvents with dramatically different volatility. The more volatile solvent evaporates during and immediately after precursor deposition. The silica precursor, typically partially hydrolyzed and condensed oligomers of TEOS, is applied to a suitable substrate and polymerized by chemical and/or thermal means until it forms a gel. The second solvent, called the Pore Control Solvent (PCS) is usually then removed by increasing the temperature until the film is dry. Assuming that no shrinkage occurs after gelation, the density/dielectric constant of the final film is fixed by the volume ratio of low volatility solvent to silica, as described by EP patent application EP 0 775 669 A2. EP 0 775 669 A2 shows a method for producing a nanoporous silica film by solvent evaporation of one or more polyol solvents, e.g., glycerol, from a metal-based aerogel precursor, but nevertheless fails to provide a nanoporous silica film having sufficiently optimized mechanical and dielectric properties, together with a relatively even distribution of material density throughout the thickness of the film.

Yet another method for producing nanoporous dielectrics is through the use of sol-gel techniques whereby a sol, which is a colloidal suspension of solid particles in a liquid, transforms into a gel due to growth and interconnection of the solid particles. One theory that has been advanced is that through continued reactions within the sol, one or more molecules within the sol may eventually reach macroscopic dimensions so that they form a solid network which extends substantially throughout the sol. At this point, called the gel point, the substance is said to be a gel. By this definition, a gel is a substance that contains a continuous solid skeleton enclosing a continuous liquid phase. As the skeleton is porous, the term "gel" as used herein means an open-pored solid structure enclosing a pore fluid. Removal of the pore fluid leaves behind empty pores.

Protecting the Surfaces of Nanometer Scale Pores

As the artisan will appreciate, a useful nanoporous film must meet a number of criteria, including having a dielectric constant ("k") falling within the required value range, having a suitable thickness ("t") (e.g., measured in Ångstroms), having an ability to effectively fill gaps, such as, e.g., interconductor and/or intercomponent spaces, on patterned wafers, and having an effective degree of hydrophobicity. If the film is not strong enough, despite achieving the other requirements, the pore structure may collapse, resulting in high material density and therefore an undesirably high dielectric constant. In addition, the surfaces of the resulting nanometer-scale pores carry silanol functional groups or moieties. Silanols, and the water that can be adsorbed onto the silanols from the environment, are highly polarizable and will raise the dielectric constant of the film. Thus, the requirement for hydrophobicity arises from the requirement for a reduced range of dielectric constant relative to previously employed materials. For this reason, preparation of nanoporous dielectric films has previously required additional processing steps to silylate free silanols on surfaces, including pore surfaces, of the film, with a capping reagent, e.g., trimethylsilyl [TMS, $(CH_3)_3SiO—$] or other suitable, art-known hydrophobic reagents.

Therefore, despite the availability of previous methods for preparing nanoporous silica films, the art recognizes a need for further, ongoing improvements in both nanoporous silica films and methods for preparing the same. In particular, there remains a continuing need in the art for new processes which eliminate some or all of the aforementioned problems, such as providing methods for making silica nanoporous films of sufficient mechanical strength that are also optimized to have a desirably low and stable dielectric constant, without the need for further processing to make the film hydrophobic.

SUMMARY OF THE INVENTION

In order to solve the above mentioned problems and to provide other improvements, the invention provides novel nanoporous silica dielectric films with a low dielectric constant ("k"), e.g., typically ranging from about 1.8 to about 2.8, as well as novel new methods of producing these dielectric films.

Broadly, the dielectric nanoporous films of the invention are prepared by mixing a non-volatile thermally degradable polymer with an organic and/or inorganic silicon-based material or mixture of such materials suitable for forming dielectric films. Such suitable organic and/or inorganic silicon-based material or materials are referred to herein, for convenience and without limitation, as spin-on glass ("S.O.G.") material(s). The resulting mixture of the base material, i.e., one or more S.O.G. materials, and the thermally degradable component can optionally form a co-polymer, but, in any event, this mixture is applied by any art-known methods to a substrate suitable for use in preparing an integrated circuit. The thermally degradable component is then is then subjected to a process of thermal treatments, leaving behind nanometer-scale voids in the solidified base material. The incorporated nanometer scale voids reduce the density of the base material to provide the desired low dielectric properties.

In a preferred embodiment of the invention, the thermally degradable component includes at least one polyalkylene oxide compound that is soluble in both the base material and that is soluble in a nonpolar solvent system, e.g., an organic-type solvent system.

In one preferred aspect of the invention, the S.O.G. base material is a compound of Formula I:

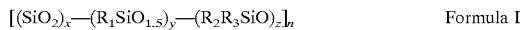
                                                              Formula I wherein x, y, z and n are positive integers of independent values, $R_1$, $R_2$ and $R_3$ are independently H or organic, and at least one of $R_1$, $R_2$ and $R_3$ is H; and $1 \geq x \geq 0$; $1 \geq y \geq 0$; $1 \geq z \geq 0$, provided that x+y+z is 1.0.

In one preferred aspect of the invention, when any of $R_1$, $R_2$ and $R_3$ are organic, the organic moiety is a $C_1$–$C_6$ alkyl.

In addition, the value of n ranges from about 100 to about 800. Other suitable S.O.G. materials for preparing the dielectric films of the invention can include, simply by way of example, hydrogensiloxanes, hydroorganosiloxanes, alkylsiloxanes and polyhydridosilsesquioxanes, to name but a few.

Further, a thermally degradable polymer or mixture of polymers suitable for the compositions and processes of the invention range in molecular weight from about 200 to about 2,000,000 Daltons, but preferably from about 1,000 to about 30,000 Daltons. Within these general parameters, a suitable component for use in the compositions and methods of the invention includes one or more of the group consisting of a polyalkylene oxide, an aliphatic polyester, an acrylic polymer, an acetal polymer, and/or combinations thereof.

In a particular aspect of the invention, a suitable component includes one or more of the group consisting of a polyalkylene oxide, a poly(caprolatactone), a poly (valeractone), a poly(methyl methacrylate), a poly (vinylbutyral) and/or combinations thereof Preferably, when the component is a polyalkylene oxide, that compound includes a $C_1$ to about $C_6$ alkyl, e.g., polypropylene oxide.

As mentioned above, the low dielectric films of the invention are produced using a heating step to volatilize an oligomer and/or polymer component of the starting S.O.G. mixture. Preferably, the heating step includes both a baking step and a curing step. In particular, the baking step includes a plurality of heating steps, ranging in temperature from about 60° C. to about 350° C., and each heating step is conducted for a time period ranging from about 0.5 to about 10 minutes. For example, in one preferred aspect of the invention, the baking process includes a first heating step of about 80° C., a second heating step of about 150° C., and a third heating step of about 200° C., each heating step being applied for a duration of about 1 minutes at each respective temperature.

When the processes of the invention include a curing step, curing is accomplished by heating the baked film at a temperature of at least 400° C. and for a time period ranging from about 10 to about 60 minutes.

DETAILED DESCRIPTION OF THE PREFERRED EMBODIMENT

Accordingly, nanoporous silica dielectric films having a dielectric constant, or k value, ranging from about 1.5 to about 3.0, can be produced by the methods of the invention. The films produced by the processes of the invention have a number of advantages over those previously known to the art, including improved mechanical strength to withstand the further processing steps required to prepare integrated circuit on the treated substrate, and a low and stable dielectric constant. The property of a stable dielectric constant is advantageously achieved without the need for further surface modification steps to render the film surface hydrophobic, thus confirming that the silica dielectric films as produced by the processes of the invention are sufficiently hydrophobic as initially formed.

As summarized in the "Description of the Prior Art" above, a number of methods for the preparation of nanoporous silica films on substrates are known to the art. In addition, a number of variations and improvement to these generally known methods for the preparation of nanoporous films are taught by co-owned U.S. patent application Ser. Nos., 09/046,475 and 09/046,473, both filed on Mar. 25, 1998; U.S patent application Ser. No. 09/054,262, filed on Apr. 3, 1998 now U.S. Pat. No. 6,048,804; and U.S. patent application Ser. Nos. 09/055,244 now U.S. Pat. No. 6,063, 330 and 09/055,516, both filed on Apr. 6, 1998, the disclosures of which are incorporated by reference herein in their entireties.

In order to better appreciate the scope of the invention, it should be understood that unless the "$SiO_2$" functional group is specifically mentioned when the term "silica" is employed, the term "silica" as used herein, for example, with reference to nanoporous dielectric films, is intended to refer to dielectric films prepared by the inventive methods from an organic or inorganic glass base material, e.g., any suitable silicon-based material. It should also be understood that the use of singular terms herein is not intended to be so limited, but, where appropriate, also encompasses the plural, e,g., exemplary processes of the invention may be described as applying to and producing a "film" but it is intended that multiple films can be produced by the described, exemplified and claimed processes, as desired.

Broadly, the processes of the invention are conducted by mixing a first component, formed of a suitable base material, such as a silicon-based S.O.G. material or blend of materials, with a second component that is susceptible to thermal degradation after the film-forming mixture has been applied to a substrate and the resulting film is heated according to the processes described below. Further, the second component is formed of one or more relatively non-volatile, but thermally degradable, polymers, copolymers and/or oligomers, and is miscible with the first component and any nonpolar solvents that may be employed in that mixture. Further still, the thermally degradable component is preferably substantially nonvolatile at typical ambient environmental temperatures, e.g., from about 20 to about 200° C., so that no significant evaporation from the applied film will occur prior to heat induced volatilization and solidification of the surrounding film composition.

Thus, once the film-forming mixture is applied by art-standard methods to the substrate, the substrate and the resulting film is heated to a temperature and for a time period sufficient to thermally degrade and/or vaporize the second component so as to leave behind nanometer scale pore structures in the film. In one preferred embodiment the film is then cured. Optionally, the heating steps can be conducted in a plurality of stages, each stage utilizing similar or differing times and temperatures, or combined into a single process step. In a further option, the heating steps can also be conducted so as to combine the curing step and the vaporization of the thermally degradable second component.

The compositions and processes of the invention are described in further detail, as follows.

STARTING MATERIALS

Substrates

Broadly speaking, a "substrate" as described herein includes any suitable composition formed before a nanoporous silica film of the invention is applied to and/or formed on that composition. For example, a substrate is typically a silicon wafer suitable for producing an integrated circuit, and the base material from which the nanoporous silica film is formed is applied onto the substrate by conventional methods, e.g., including, but not limited to, the art-known methods of spin-coating, dip coating, brushing, rolling, and/or spraying. Prior to application of the base materials to form the nanoporous silica film, the substrate surface is optionally prepared for coating by standard, art-known cleaning methods.

Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("$SiO_2$") and mixtures thereof On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer. Other optional features of the surface of a suitable substrate include an oxide layer, such as an oxide layer formed by heating a silicon wafer in air, or more preferably, an $SiO_2$ oxide layer formed by chemical vapor deposition of such art-recognized materials as, e.g., plasma enhanced tetraethoxysilane ("PETEOS") silane oxide and combinations thereof, as well as one or more previously formed nanoporous silica dielectric films.

The nanoporous silica film of the invention can be applied so as to cover and/or lie between such optional electronic surface features, e.g., circuit elements and/or conduction pathways that may have been previously formed features of the substrate. Such optional substrate features can also be applied above the nanoporous silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a nanoporous silica film of the invention, during the manufacture of a multilayer and/or multicomponent integrated circuit.

In a further option, a substrate bearing a nanoporous silica film or films according to the invention can be further covered with any art known non-porous insulation layer, e.g., a glass cap layer.

First Component—Silicon-Based Polymers

In one embodiment, the starting materials, i.e., the first component, or silica starting material(s) for conducting the processes of the invention, includes organic and/or inorganic base materials suitable for use in coating a substrate. These are typically materials that are suitable for use as spin-on-glasses. Spin-on-glasses (S.O.G.) are silicon-based dielectric materials that are prepared in a solution form to be used for insulation, planarization and gap-filling in the fabrication of integrated circuits on a suitable substrate (e.g., wafer). S.O.G. solution materials can be applied onto a substrate by any art-known methods, including dipping, brushing, rolling, spraying, but are most typically applied by spin-coating.

Suitable S.O.G. materials for use in the methods of the invention are silicon-based materials that can be prepared from appropriate functional units, including, for example, at least one of the following.

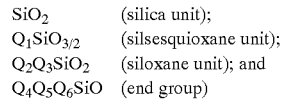

wherein $Q_1$, $Q_2$, $Q_3$, $Q_4$, $Q_5$ and $Q_6$ are organic, and can be the same or different, The term "organic" encompasses any suitable organo-moiety, including alkyl, which can be straight, branched and/or cyclic alkyl, as well as arylalkyl, any of which can be substituted or unsubstituted, and combinations thereof The "organic" term also encompasses aryl and heteroaryl, substituted and unsubstituted organo-moieties.

Thus, in another embodiment of the invention, when any of $Q_1$, $Q_2$, $Q_3$, $Q_4$, $Q_5$ and $Q_6$ are organic, it is preferred that such moiety be an alkyl, preferably a $C_{1-6}$alkyl. In another embodiment, any of $Q_1$, $Q_2$, $Q_3$, $Q_4$, $Q_5$ and $Q_6$ can independently be an aryl moiety, preferably a $C_6$–$C_{12}$ aryl.

In yet a still further embodiment of the invention, the base material is a hydridosilsequioxane or hydridosiloxane that have the general structure of Formula I, as follows.

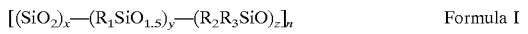

Formula I wherein $R_1$, $R_2$ and $R_3$ are independently selected from H and/or an organic moiety, but at least one of $R_1$, $R_2$ and $R_3$ is H. Preferably, the organic moiety is an alkyl selected so that the base material is suitable for use as an S.O.G. material, as understood by the art. More preferably, the base material is a $C_1$–$C_6$ alkyl and x, y and z each independently range in value from 1 to zero, i.e., $1 \geq x \geq 0$; $1 \geq y \geq 0$; $1 \geq z \geq 0$ provided that x+y+z is 1.0.

Further, particular types of base materials each have a preferred range of values for the above described parameters of Formula I, as follows.

When the base material is a polyhydridosilsesquioxane ("PHSQ"), y is 1 and $R_1$ is H.

When the base material is a silica, x is 1.

When the base material is a polymethylsilsesquioxane, y is 1 and $R_1$ is methyl.

When the base material is a polymethylhydridosilsesquioxane, y is 1 and $R_1$ is a mixture of H and methyl.

In a further embodiment of the invention, base materials useful for the invention also include: hydrogensiloxanes polymers which have the structure of,

Formula II;

hydroorganosiloxanes which have one of the following formulae,

Formula III

In each of polymer formulae (II and III), (a) ranges from about 6 to about 20, (b) ranges from about 1 to about 3, (c) ranges from about 6 to about 20, n ranges from 1 to about 4,000, and each R (in Formula III, when n>1) is independently H, $C_1$–$C_8$ alkyl or $C_6$–$C_{12}$ aryl. The weight average molecular weight may range from about 1,000 to about 220,000. In a preferred embodiment, for Formulas I, II and III, n ranges from about 100 to about 800, yielding a molecular weight of from about 5,000 to about 45,000. More preferably, n ranges from about 250 to about 650 yielding a molecular weight of from about 14,000 to about 36,000.

In a still further embodiment of the invention, the alkylsiloxanes can also include hydrogen alkylsiloxanes, such as, simply by way of example, hydrogenmethylsiloxane, hydrogenethylsiloxane, hydrogenpropylsiloxane, hydrogenbutylsiloxane, hydrogentert-butylsiloxane, hydrogenphenylsiloxane and combinations thereof, to name but a few.

In yet a still further embodiment of the invention, the S.O.G. materials for conducting the processes of the invention include, for example hydrogensilsesquioxane, hydrogenmethylsilsesquioxane, hydrogenethylsilsesquioxane, hydrogenpropylsilsesquioxane, hydrogenbutylsilsesquioxane, hydrogenlertbutylsilsesquioxane and hydrogenphenylsilsesquioxane.

In a preferred embodiment of the invention, as exemplified below, the S.O.G. materials include polyhydridosilsesquioxane ("PHSQ") base materials. Porous polyhydridosilsequioxane (PHSQ) film is produced from the decomposition of the thermally degradable organic component in a polyhydridosilsequioxane/organic system. The polyhydridosilsequioxane is prepared from the hydrolysis of trialkoxysilane or trichlorosilane in a controlled reaction condition. The chemical composition of the polyhydridosilsesquioxane can be represented by the following formula:

Formula IV wherein n is an integer ranging from about 10 to about 4,000. In a preferred embodiment, n is an integer ranging from about 20 to about 1,000.

Thermally Degradable Polymer Components

The second component, i.e., the thermally degradable component for use in the processes of the invention, is preferably miscible with the first component. and can optionally form a co-polymer therewith. The thermally degradable component is also sufficiently thermally degradable under the heating conditions employed according to the invention, for forming a useful nanoporous dielectric film on a substrate, so as to be useful for the manufacture of an integrated circuit. The thermally degradable component is also soluble in a nonpolar solvent or solvents and/or mixtures thereof.

The terms, "degradable" or "thermally degradable" as employed herein, in reference to the component that is to be thermally degraded under the heating conditions of the inventive process, includes both physical evaporation of a relatively volatile fraction of the thermally degradable component during the heating step(s) and/or degradation of the component(s) into more volatile molecular fragments. Without wishing to be bound by any theory or hypothesis, it is believed that the heating steps degrade the organic polymer component by either direct vaporization or chemical disruption of the polymer by the applied heat, or disruption of the polymer by any reactive species induced in the film structure by the applied heat. In any event, the thermal degradation of the organic polymer component forms nanometer-scale voids in the film structure.

It is also important that the thermally degradable component be substantially nonvolatile prior to the heating step, i.e., at room temperature. Thus, the thermally degradable component is not so volatile as to significantly evaporate prior to the time during the heating of the film when the silicon polymer(s) begins to achieve cross-linking. As confirmed by the Examples provided below, if significant evaporation does take place too early in the process, the resulting film density, and therefore the dielectric constant, will be higher than would otherwise be produced in that film. Thus, without meaning to be bound by any theory or hypothesis as to how the invention operates, it is believed that undesirable "significant" pre-heating evaporation is evaporation that takes place prior to the cross-linking of the S.O.G. material at such a rate and in such a proportion of the applied film, so as to result in the production of an undesirably dense dielectric film.

The term, "polymer" as employed herein also encompasses the terms oligomers and/or copolymers, unless expressly stated to the contrary.

Preferred thermally degradable polymers according to the invention will have molecular weights in a range that is effective to be thermally degraded in the temperature range of the heating steps, but the molecular weight should not be so low as to allow significant evaporation prior to the baking step(s), for the reasons discussed above. Preferably, thermally degradable polymer(s) employed according to the invention will have a molecular weight ranging from about 200 to about 2,000,000, or more, Daltons. More preferably, such a polymer will have a molecular weight ranging from about 1,000 to about 30,000 Daltons, or even from about 2,000 to about 10,000 Daltons.

In another preferred embodiment, the thermally degradable polymer according to the invention is a polyalkylene oxide. The polyalkylene oxide includes an alkyl moiety, ranging, e.g., from $C_1$ to about $C_6$. Preferably, when the first component is a PHSQ, the degradable component is a polypropylene oxide ("PPO"). Other suitable thermally degradable polymers include, without limitation, aliphatic polyesters, including, for example, poly(caprolactone) and poly(valeralactone); acrylic polymers, including, for example, poly(methyl methacrylate) and acetal polymers, including, for example, poly (vinylbutyral), to name but a few.

The thermally degradable polymers can also be chemically bonded to the silicon-based polymers to form a copolymer, including, simply by way of example, PHSQ-polypropylene oxide copolymers, PHSQ-polycaprolactone copolymers and/or combinations thereof Solvents A suitable solvent or cosolvent optionally employed in the film forming mixture that is applied to the substrate will, broadly, be a nonpolar solvent that has a boiling point of 200° C. or less, and preferably the boiling point will range from about 80 to about 160° C. Simply by way of example, and without limitation, nonpolar solvents useful according to the invention include acetates (ethyl acetate, isopropyl acetate, butyl acetate), ethers (dibutyl ether), and ketones (acetone, methyl ethyl ketone, methyl isobutyl ketone).

In one particular embodiment the acetate solvent is an organic acetate or mixture of acetates. Preferably, the organic moiety of the organic acetate is a $C_1$ to $C_6$ alkyl, a $C_5$ to $C_{12}$ aryl and or derivatives or combinations thereof As shown in the examples below, the employed polypropylene oxide (PPO) is dissolved in ethyl acetate and/or a mixture of ethyl and n-butyl acetate. The useful ratios of ethyl- to n-butyl acetate range generally from about 20:80 (wt/wt) to about 80:20 (wt/wt), and more preferably from about 50:50 to about 60:40. As exemplified below, a ratio of ethyl- to n-butyl acetate of about 70:30 (wt/wt) is readily employed.

The thermally degradable polymer is dissolved in the solvent in a percentage ranging, simply by way of example, from about 3 wt % to about 50 wt % or more particularly in a percentage ranging from about 5 wt % to about 30 wt %.

Process Parameters

In the processes of the invention, a mixture of the S.O.G. i.e., silicone-based polymer(s), and thermally degradable polymer(s) and/or oligomers and optional solvent(s) is prepared in a suitable ratio. The prepared mixture of S.O.G. and degradable polymers and/or oligomers and optional solvent (s) is applied to a suitable substrate by an appropriate art-known means.

When the mixture is applied to the substrate by centrifugation, i.e., when it is spun-on, the conditions are those conventionally used for such application, e.g., the substrate is spun at about 2,000 to 4,000 rpms. The artisan will appreciate that specific conditions for application to a substrate will depend upon the selected materials, substrate and desired nanoscale pore structure, as is readily determined by routine manipulation of these parameters.

The applied film broadly has a composition that includes a thermally degradable polymer component in a wt % ranging from about 10 wt % to about 80 wt %, more particularly from about 15 wt % to about 70 wt %, and even more particularly from about 30 wt % to about 70wt %.

The applied film is then baked and thereafter cured to form the nanoscale pore structures within the film, by thermally induced evaporation or decomposition of the thermally degradable polymer component. Baking/curing is done at a temperature and for a time period effective to degrade and/or vaporize the degradable component, e.g., PPO, and cause such nanometer scale pores to form. Preferably, the heating steps are conducted on a hot plate and/or in a oven, and optionally on a conveyer belt moving through a suitable hot zone. In a preferred embodiment, baking temperatures range from about 60° C. to about 350° C., more preferably from about 70° C. to about 300° C. or from about 80° C. to about 250° C.

Baking times will depend upon the materials selected and the desired results, but will generally range from about 30 seconds to about 10 minutes in the about 60° C. to about 350° C. temperature range; from about 0.5 to about 6 minutes in the about 70° C. to about 300° C. temperature range; and from about 0.5 to about 3 minutes in the about 80° C. to about 250° C. temperature range.

The artisan will appreciate that specific temperature ranges and baking and/or curing conditions will depend upon the selected materials, substrate and desired nanoscale pore structure, as is readily determined by routine manipulation of these parameters. Generally, the curing step comprises heating the baked film at a temperature of at least 400° C. and for a time period ranging from about 10 to about 60 minutes.

Properties Of the Produced Nanoporous Silica Films

Nanoporous dielectric films formed on a substrate according to the invention are generally formed with a pore size that ranges from about 1 nm to about 100 nm, more preferably from about 2 nm to about 30 nm, and most preferably from about 3 nm to about 20 nm. The density of the silicon-containing composition, including the pores, ranges from about 0.1 to about 1.9 $g/cm^3$, more preferably from about 0.25 to about 1.6 $g/cm^3$, and most preferably from about 0.4 to about 1.2 $g/cm^3$.

Thus, the percentage of the nanoporous dielectric film produced by the methods of the invention that are represented by void space, i.e., nanometer scale pores, can range, e.g., from about 10 to about 70 percent, or greater, and preferably from about 20 to about 50 percent.

The refractive index is another indicator of the relative density of dielectric films produced from S.O.G. materials. The dielectric of the hydridosilsesquioxane or methyl silsesquioxane starting materials that are exemplified herein range from about 2.5 to about 3.3. The refractive index of dielectric films produced by the inventive methods range in value from about 1.15 to about 1.4, and more preferably from about 1.9 to about 1.31.

Given the low densities achieved by the methods and compositions of the invention, low dielectric constant or k values are attainable, ranging from about 1.5 to about 3.0, preferably from about 2.0 to about 2.8, and more preferably from about 1.8 to about 2.8.

EXAMPLES

Porous methylsiloxane coatings are produced from the removal of a thermally degradable, organic component from a film prepared from a mixture of an S.O.G. and a thermally degradable organic polymer in a nonpolar solvent. The exemplified S.O.G. base materials are polyhydridosilsesquioxanes ("PHSQs"). The exemplified thermally degradable polymer is polypropylene oxide ("PPO"). The artisan will appreciate that PPOs and/or a mixture of PPO and polyethylene oxide ("PEO") copolymers useful for the inventive processes, are selected to thermally degrade in a temperature range that is relatively low compared to the thermal tolerances of the employed substrate and S.O.G. materials. The PPO and/or a mixture of PPO/PEOs are also selected to be soluble in nonpolar solvents that are compatible with the inventive processes, and to be miscible with the selected S.O.G. materials.

Processing steps include dissolving appropriate quantities of, e.g., a PPO into, e.g., a PHSQ solution, then casting the mixture onto a substrate by a suitable method, such as spinning, and then baking and optionally curing the spun film at a temperature range and for a time period or periods appropriate for the selected PHSQ material. The following non-limiting examples serve to illustrate the invention.

EXAMPLE 1

Preparation of Polyhydridosilsesquioxane 160 gm of triethoxysilane was mixed with 800 gm acetone. 11.7 gm of water and 14.6 gm of 0.02N nitric acid were added to the triethoxysilane/water solution. The final solution was stored at 22° C. for 10 days.

After a 10-day reaction at 22° C., the by-product ethanol was vacuum distilled off at temperature between 22 and 25° C. while ethyl acetate was continuously adding to the solution to replace the leaving ethanol. After distillation, n-butyl acetate was added to adjust the final composition to be 10 wt % PHSQ resin, 63 wt % ethyl acetate, and 27 wt % n-butyl acetate. This is the PHSQ solution. These proportions are equivalent to 70 wt % ethyl acetate and 30 wt % n-butyl acetate, if the 10% PHSQ resin is omitted.

EXAMPLE 2

Preparation and Composition of the Spinning Solutions

1. Base Matrix Materials

Polyhydridosilsesquioxane resin as prepared in Example 1 was dissolved in mixture of ethyl acetate and butyl acetate in a ratio of 70:30, by weight was used.

2. Decomposable Components

Polypropylene oxide was dissolved in ethyl acetate at four different percents: 5, 10, 15, and 20% (wt/wt). The PPO solutions were then mixed with the PHSQ solution as prepared in Example 1, in a 50:50 (wt/wt) ratio.

Three polypropylene oxide polymers with molecular weights of 425, 1000 and 4000, respectively, were used. The polypropylene oxide was dissolved in ethyl acetate.

3. Composition of the as-spun film

Symbols designated to describe the coating solutions are (base matrix)-(MW of the PPO)-(wt. % of PPO). For example, PHSQ-1000-33.3 represents 33.3 wt. % of polypropylene oxide of molecular weight 1000 and 66.7% PHSQ in the as-spun film. The following six samples were prepared:

PHSQ (control)
PHSQ-425-50%
PHSQ-425-66.6%
PHSQ-1000-33.3%
PHSQ-1000-50%
PHSQ-1000-60%
PHSQ-4000-50%
PHSQ-1000-66.60%

4. Spin and Bake/Cure Cycles

Samples were spun at 3000 rpm for 20 seconds, baked at 80° C./150° C./200° C. for 60 seconds and cured at 400° C. for 30 minutes in flowing nitrogen.

5. Refractive Index and Dielectric Constant

Refractive index and film thickness was measured by a Woolam elipsometer and dielectric constant was calculated from the capacitance using a Hewlett-Packard LCR meter (Model HP4275A). The PPO %, and the measured thickness, refractive index and dielectric constants of the cured films are listed in the following table.

TABLE 1

|  | Wt. % of PPO in SOG | Wt % of PPO in as-spun film | Cured Film Thickness, Å | R.I.* | k** |
|---|---|---|---|---|---|
| PHSQ | 0 | 0 | 3280 | 1.383 | 3.1 |
| PHSQ-425-50% | 5 | 50 | 3980 | 1.341 | — |
| PHSQ-425-66.6% | 10 | 66.6 | 5070 | 1.286 | — |
| PHSQ-1000-33.3% | 2.5 | 33.3 | 2200 | 1.291 | 2.8 |
| PHSQ-1000-50% | 5 | 50 | 3200 | 1.237 | 2.5 |
| PHSQ-1000-60% | 7.5 | 60 | 3300 | 1.226 | 2.3 |
| PHSQ-4000-50% | 5 | 50 | 3200 | 1.227 | 2.4 |
| PHSQ-4000-66.6% | 10 | 66.6 | 5200 | 1.175 | 2.0 |

*Refractive Index;
**Dielectric Constant

6. Discussion & Conclusion

It can be appreciated from the data presented by Table 1 that when the PPO molecular weights are 1000 and 4000, the refractive index ("R.I.") and dielectric constant ("k") of the produced PHSQ films decrease proportionately as the amount of the PPO in the initial composition is increased. Thus, a porous film with dielectric constant around 2.0 can be obtained at 66 weight percent of PPO in the solid of the as-spun film.

It should also be noted that the refractive index measurements for the PPO 425 series are about 0.1 higher than the measurements obtained from similar loading with higher molecular weight PPO. This increase corresponds to an increase of 0.5 in the measured higher dielectric constant. This can be attributed to the partial physical evaporation of volatile species in the low molecular weight PPO during baking steps, resulting in actually less degradable component in the post-bake films.

Based on the same principle, it will be appreciated that films with a dielectric constant of less than 2.0 can readily be obtained by incorporating a higher loading of the decomposable polymer. This approach can also be applied to other low k silsesquioxane films with a general structure of R SiO$_{3/2}$ where R can be chosen independently from hydrogen or alkyl or mixture of both.

What is claimed is:

1. A low dielectric nanoporous film comprising a spin-on-glass material, said film having been produced by a process comprising the steps of
    (a) preparing a mixture of at least one spin-on-glass material, a thermally degradable polymer which is soluble in a nonpolar solvent, and a nonpolar solvent,
    (b) applying the mixture of step (a) onto a substrate to produce a coated substrate,
    (c) heating the coated substrate of step (b) for a time and at one or more temperatures effective produce the desired low dielectric nanoporous film.

2. The low dielectric nanoporous film of claim 1 having a dielectric constant ranging from about 1.5 to about 3.0.

3. The low dielectric nanoporous film of claim 1 having a dielectric constant ranging from about 1.8 to about 2.8.

4. The low dielectric nanoporous film of claim 1 having a refractive index ranging from about 1.40 to about 1.15.

5. The low dielectric nanoporous film of claim 1 produced from a spin-on glass base material of Formula I:

$$[(SiO_2)_x-(R_1SiO_{1.5})_y-(R_2R_3SiO)_z]_n \qquad \text{Formula I}$$

wherein x, y, z and n are positive integers of independent values, $R_1$, $R_2$ and $R_3$ are independently H or organic, and at least one of $R_1$, $R_2$ and $R_3$ is H; and $1 \geq x \geq 0$; $1 \geq y \geq 0$; $1 \geq z \geq 0$, provided that x+y+z is 1.0.

6. The low dielectric nanoporous film of claim 5 wherein the organic moiety is a $C_1$–$C_6$ alkyl.

7. The low dielectric nanoporous film of claim 5 wherein n ranges from about 100 to about 800.

8. The low dielectric nanoporous film of claim 1 produced from a hydrogensiloxane spin-on glass base material of Formula II $$[(HSiO_{1.5})_{(a)}O_{(b)}]_n \qquad \text{Formula II;}$$

wherein (a) ranges from about 6 to about 20, (b) ranges from about 1 to about 3, (c) ranges from about 6 to about 20, and n ranges from 1 to about 4,000.

9. The low dielectric nanoporous film of claim 1 produced from a hydroorganosiloxane spin-on glass base material of Formula III $$[(HSiO_{1.5})_{(a)}O_{(b)}(RSiO_{1.5})_{(c)}]_n \qquad \text{Formula III}$$

wherein (a) ranges from about 6 to about 20, (b) ranges from about 1 to about 3, (c) ranges from about 6 to about 20, and n ranges from 1 to about 4,000, and when n>1, each R is independently H, $C_1$–$C_8$ alkyl or $C_6$–$C_{12}$ aryl.

10. The low dielectric nanoporous film of claim 1 produced from an alkylsiloxane spin-on glass base material selected from the group consisting of hydrogenmethylsiloxane, hydrogenethylsiloxane, hydrogenpropylsiloxane, hydrogenbutylsiloxane, hydrogentert-butylsiloxane, hydrogenphenylsiloxane and combinations thereof.

11. The low dielectric nanoporous film of claim 1 produced from an alkylsiloxane spin-on glass base material selected from the group consisting of hydrogensilsesquioxane, hydrogenmethylsilsesquioxane, hydrogenethylsilsesquioxane, hydrogenpropylsilsesquioxane, hydrogenbutylsilsesquioxane, hydrogenterbutylsilsesquioxane, hydrogenphenylsilsesquioxane, and combinations thereof.

12. The low dielectric nanoporous film of claim 1 produced from a polyhydridosilsesquioxane spin-on glass base material of Formula IV $$(HSiO_{3/2})_n \qquad \text{Formula IV}$$

wherein n is an integer ranging from about 10 to about 4,000.

13. The low dielectric nanoporous film of claim 1 wherein the thermally degradable polymer ranges in molecular weight from about 200 to about 2,000,000 Daltons.

14. The low dielectric nanoporous film of claim 13 wherein the thermally degradable polymer ranges in molecular weight from about 1,000 to about 30,000 Daltons.

15. The low dielectric nanoporous film of claim 14 wherein the thermally degradable polymer is selected from the group consisting of polyalkylene oxide, aliphatic polyester, acrylic polymer, acetal polymer, and combinations thereof.

16. The low dielectric nanoporous film of claim 15 wherein the thermally degradable polymer is selected from the group consisting of polyalkylene oxide, poly (caprolatactone), poly(valeractone), poly(methyl methacrylate), poly (vinylbutyral).

17. The low dielectric nanoporous film of claim 16 wherein the polyalkylene oxide comprises a from $C_1$ to about $C_6$ alkyl.

18. The low dielectric nanoporous film of claim 17 wherein the thermally degradable polymer is a polypropylene oxide.

19. The low dielectric nanoporous film of claim 1 wherein the heating of step (c) comprises a baking step and a curing step.

20. The low dielectric nanoporous film of claim 19 wherein the baking step comprises a plurality of heating steps, ranging in temperature from about 60° C. to about 350° C., and each heating step is for a time period ranging from about 0.5 to about 10 minutes.

21. The low dielectric nanoporous film of claim 19 wherein the baking comprises a first heating step of about 80° C., a second heating step of about 150° C., and a third heating step of about 200° C., each heating step being applied for a duration of about 1 minutes at each respective temperature.

22. The low dielectric nanoporous film of claim 19 wherein the curing step comprises heating the baked film at a temperature of at least 400° C. and for a time period ranging from about 10 to about 60 minutes.

23. The low dielectric nanoporous film of claim 1 wherein the substrate comprises a semiconductor material selected from the group consisting of gallium arsenide, silicon, and mixtures thereof.

24. The low dielectric nanoporous film of claim 23 wherein the silicon material is selected from the group consisting of crystalline silicon, polysilicon, amorphous silicon, epitaxial silicon, and silicon dioxide.

25. The low dielectric nanoporous film of claim 24 wherein the substrate comprises a surface layer applied by chemical vapor deposition selected from the group consisting of plasma enhanced tetraethoxysilane, silane oxide and combinations thereof.

26. The low dielectric nanoporous film of claim 1 wherein the thermally degradable polymer is soluble in a solvent selected from the group consisting of nonpolar solute compatible organic acetate, ether a ketone, and combinations thereof.

27. The low dielectric nanoporous film of claim 26 wherein the solvent is selected from the group consisting of ethyl acetate, isopropyl acetate, butyl acetate, dibutyl ether, acetone, methyl ethyl ketone, methyl isobutyl ketone and combinations thereof.

28. The low dielectric nanoporous film of claim 26 wherein the solvent is an organic acetate comprising a $C_1$ to $C_6$ alkyl, a $C_5$ to $C_{12}$ aryl and combinations and derivatives thereof.

29. An integrated circuit comprising at least one low dielectric nanoporous film of claim 1.

30. A method of producing a low dielectric nanoporous film on a substrate comprising the steps of
(a) preparing a mixture of at least one spin-on-glass material, a suitable thermally degradable polymer soluble in a nonpolar solvent, and a nonpolar solvent,
(b) applying the mixture of step (a) onto a substrate to produce a coated substrate,
(c) heating the coated substrate of step (b) for a time and at one or more temperatures effective produce the desired low dielectric nanoporous film.

31. The low dielectric nanoporous film of claim 1 wherein the substrate comprises a semiconductor material.

32. A microelectronic device comprising at least one low dielectric nanoporous film of claim 1.

* * * * *